(12) United States Patent
Tamaki et al.

(10) Patent No.: US 7,824,987 B2
(45) Date of Patent: Nov. 2, 2010

(54) METHOD OF MANUFACTURING A SEMICONDUCTOR DEVICE INCLUDING A SRAM SECTION AND A LOGIC CIRCUIT SECTION

(75) Inventors: Tokuhiko Tamaki, Osaka (JP); Naoki Kotani, Hyogo (JP); Shinji Takeoka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/539,203

(22) Filed: Aug. 11, 2009

(65) Prior Publication Data

US 2009/0298255 A1 Dec. 3, 2009

Related U.S. Application Data

(62) Division of application No. 11/808,620, filed on Jun. 12, 2007, now Pat. No. 7,598,574.

(30) Foreign Application Priority Data

Aug. 9, 2006 (JP) .............................. 2006-217341

(51) Int. Cl.
*H01L 21/8234* (2006.01)
*H01L 21/336* (2006.01)
(52) U.S. Cl. .................. 438/275; 438/283; 257/E21.53
(58) Field of Classification Search .................. 438/275, 438/283; 257/E21.53
See application file for complete search history.

(56) References Cited

U.S. PATENT DOCUMENTS

| 5,122,474 | A | 6/1992 | Harrington, III |
| 5,789,762 | A * | 8/1998 | Koyama et al. ............... 257/66 |
| 6,010,929 | A | 1/2000 | Chapman |
| 6,081,016 | A * | 6/2000 | Tanaka et al. ............... 257/377 |
| 6,506,647 | B2 * | 1/2003 | Kuroda et al. ............... 438/275 |
| 6,936,844 | B1 | 8/2005 | Yamazaki et al. |
| 7,129,543 | B1 | 10/2006 | Maeda et al. |
| 7,411,253 | B2 * | 8/2008 | Shimizu et al. ............. 257/371 |
| 7,414,292 | B2 | 8/2008 | Ema et al. |
| 2004/0183141 | A1 | 9/2004 | Nakaoka et al. |
| 2004/0256653 | A1 | 12/2004 | Iwata et al. |
| 2006/0138568 | A1 | 6/2006 | Taniguchi et al. |
| 2007/0221960 | A1 | 9/2007 | Ashida |
| 2008/0036014 | A1 * | 2/2008 | Akamatsu et al. ........... 257/391 |
| 2009/0039427 | A1 * | 2/2009 | Shimizu et al. ............. 257/344 |

* cited by examiner

*Primary Examiner*—Ngan Ngo
(74) *Attorney, Agent, or Firm*—McDermott Will & Emery LLP

(57) ABSTRACT

A semiconductor device including a SRAM section and a logic circuit section includes: a first n-type MIS transistor including a first n-type gate electrode formed with a first gate insulating film interposed on a first element formation region of a semiconductor substrate in the SRAM section; and a second n-type MIS transistor including a second n-type gate electrode formed with a second gate insulating film interposed on a second element formation region of the semiconductor substrate in the logic circuit section. A first impurity concentration of a first n-type impurity in the first n-type gate electrode is lower than a second impurity concentration of a second n-type impurity in the second n-type gate electrode.

13 Claims, 7 Drawing Sheets

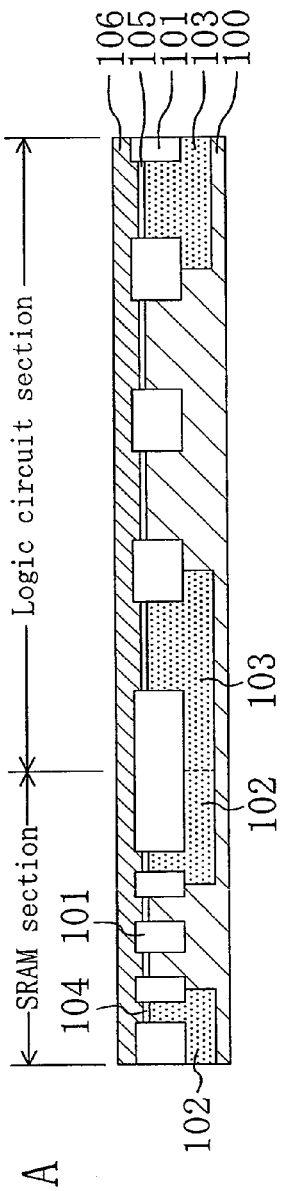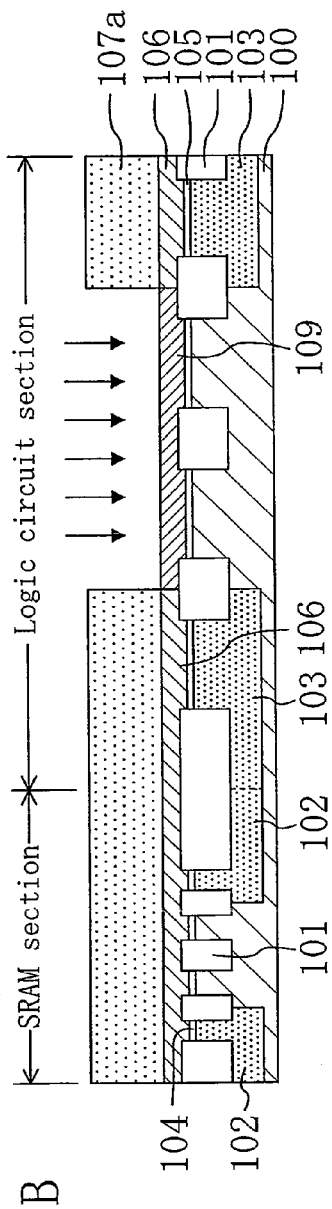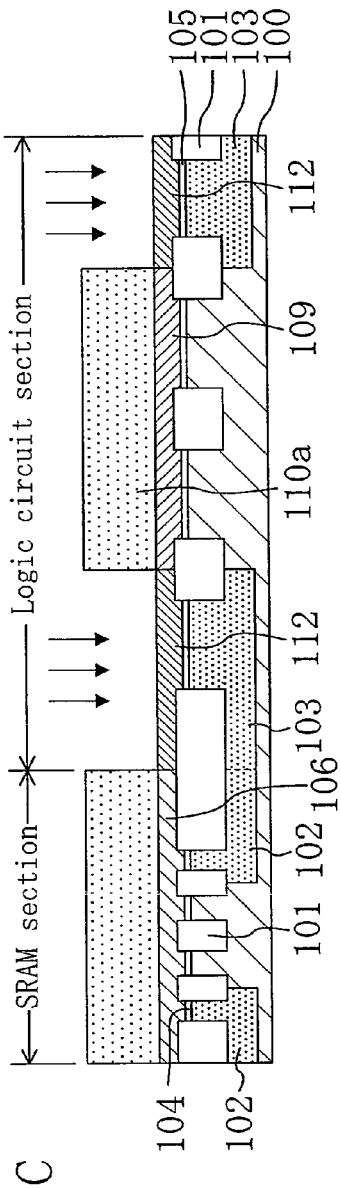
FIG. 1A
FIG. 1B
FIG. 1C

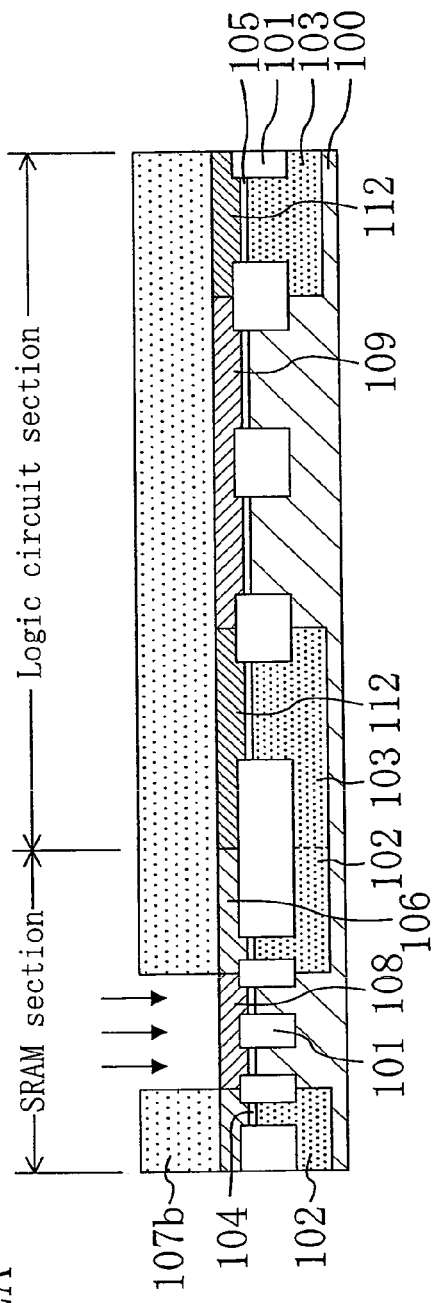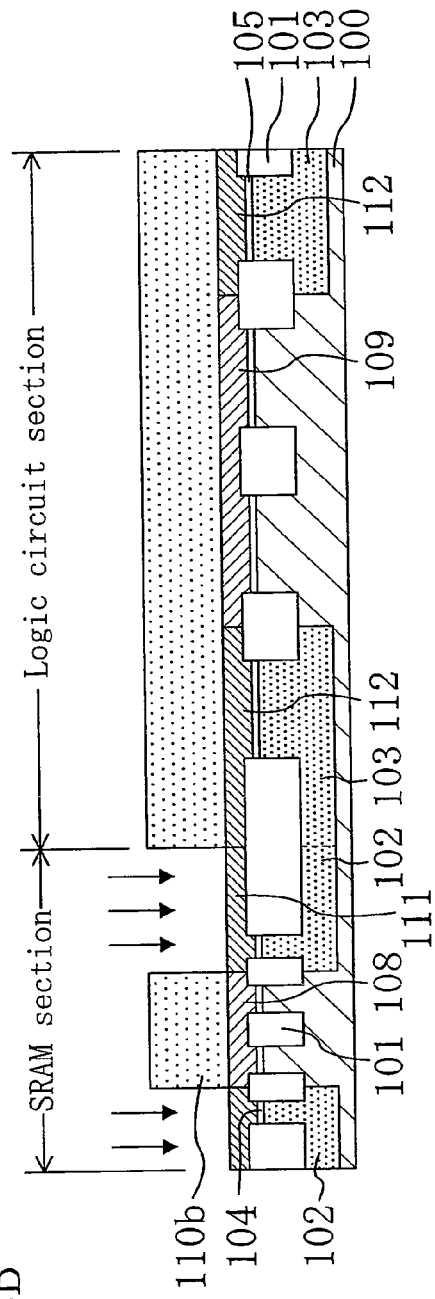

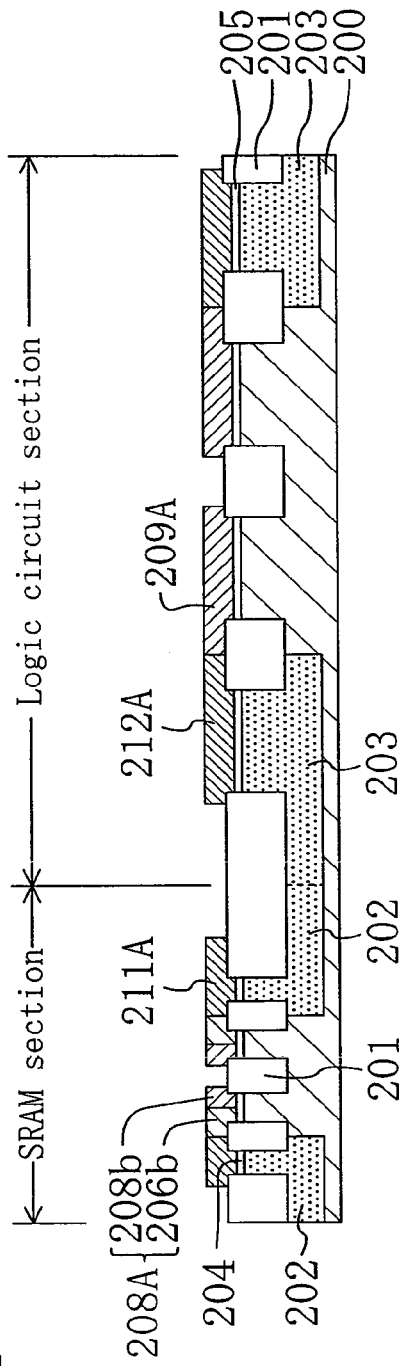
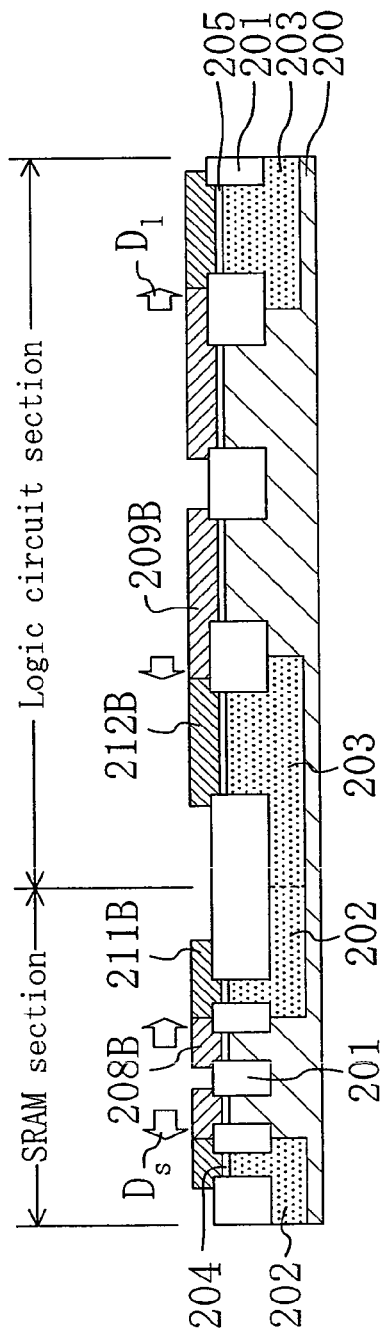
FIG. 5A
FIG. 5B

METHOD OF MANUFACTURING A SEMICONDUCTOR DEVICE INCLUDING A SRAM SECTION AND A LOGIC CIRCUIT SECTION

CROSS REFERENCE TO RELATED APPLICATIONS

This application is a divisional of U.S. Application Ser. No. 11/808,620, filed Jun. 12, 2007 now U.S. Pat. No. 7,598,574, which claims priority under 35 U.S.C §119(a) on Patent Application No. JP 2006-217341 filed in Japan on Aug. 9, 2006, the entire contents of which are hereby incorporated by reference.

BACKGROUND OF THE INVENTION

The present invention relates to a semiconductor device including a SRAM section and a logic circuit section and a manufacturing method thereof.

As is well known, dual gate structures have become a mainstream in the art in association with increases in accuracy of threshold voltages of n-type MIS transistors and p-type MIS transistors which are accompanied by voltage lowering in CMIS (Complementary Metal-Insulator-Semiconductor) devices used in large-scale integrated circuits.

In general, a dual gate structure employs a polysilicon electrode as an n-type gate electrode composing an n-type MIS transistor and a polysilicon electrode as a p-type gate electrode composing a p-type MIS transistor, wherein an n-type impurity is introduced to the n-type gate electrode while a p-type impurity is introduced to the p-type gate electrode. In many cases, the n-type gate electrode and the p-type gate electrode are formed integrally with each other by siliciding the surface of one polysilicon pattern.

Of various methods for introducing a conductive impurity to an n-type gate electrode or a p-type electrode, the conductive impurity is introduced to a polysilicon film before patterning the polysilicon film in some methods, and the conductive impurity is introduced to the n-type gate electrode and the p-type electrode while at the same time being introduced to source/drain regions in other methods. In both cases, thermal treatment is performed after implantation of the conductive impurity for promoting mutual diffusion of an n-type impurity in the n-type gate electrode and a p-type impurity in the p-type electrode in the integrally-formed n-type and p-type gate electrodes.

In order to reduce power consumption and cost, miniaturization of semiconductor devices and improvement on transistor characteristics are progressing more and more.

Referring to, for example, a semiconductor device including a SRAM section and a logic circuit section, it is demanded for further miniaturization of the semiconductor device to reduce a width of an element isolation region that electrically separate an n-type MIS transistor and a p-type MIS transistor in the SRAM section to the limit on the level that can secure the element isolation characteristics.

On the other hand, in the logic circuit section, which determines the operation speed of the semiconductor device, it is demanded to reduce the thickness of the gate insulating film composing respective conductivity type MIS transistors.

The use of a SiON film as the gate insulating film for thickness reduction thereof for the purpose of improving the transistor characteristics involves problems on reliability, such as TDDB (Time Dependent Dielectric Breakdown), and the like.

Alternatively, the use of a high-k film, such as a HfSiON, film or the like, which can achieve electrical reduction in thickness of the gate insulating film rather than physical reduction therein, involves difficulty in control on threshold voltages of the transistors.

In view of the foregoing, in order to achieve electrical reduction in thickness of the gate insulating film in the case employing a combination of, for example, polysilicon electrodes and an insulating film formed of a SiON film, the impurity concentrations of the gate electrodes are increased in some methods.

In addition, in the case employing a combination of, for example, metal gate electrodes and a gate insulating film formed of a SiON film or a high-k film, the impurity concentrations of the gate electrodes are increased in some methods for controlling the threshold voltage of the transistors.

Nevertheless, the following problems are involved in the semiconductor devices including the gate electrodes of which impurity concentrations are increased for the purpose of electrical reduction in thickness of the gate insulating film or control on the threshold voltages of the transistors. The problems in the semiconductor device will be described as a conventional example with reference to FIG. 6A to FIG. 6C and FIG. 7A to FIG. 7B. FIG. 6A to FIG. 6C and FIG. 7A to FIG. 7B are sectional views of a main part in the gate width direction of the semiconductor device for showing respective steps of a semiconductor device manufacturing method in the conventional example.

First, as shown in FIG. 6A, element isolation regions 301 formed of silicon oxide films buried in trenches are formed selectively in upper parts of a semiconductor substrate 300 made of p-type silicon by shallow trench isolation (STI). Then, a SRAM section n-type well region 302 is formed in a p-type MIS formation region of the semiconductor substrate 300 in the SRAM section while a logic circuit section n-type well region 303 is formed in a p-type MIS formation region of the semiconductor substrate 300 in the logic circuit section.

Next, a SRAM section gate insulating film 304 formed of a silicon oxynitride (SiON) film having a thickness of 1.7 nm is formed in a region surrounded by the element isolation regions 301 of the semiconductor substrate 300b in the SRAM section while a logic circuit section gate insulating film 305 formed of a SiON film having a thickness of 1.7 nm is formed in a region surrounded by the element isolation regions 301 of the semiconductor substrate 300 in the logic circuit section. Then, low pressure CVD is performed to form a gate electrode formation film 306 formed of a polysilicon film having a thickness of 100 nm on the entirety of the semiconductor substrate 300.

Subsequently, as shown in FIG. 6B, an n-type impurity, such as phosphorous or the like is implanted to the gate electrode formation film 306 on each of the n-type MIS formation regions in the SRAM section and the logic circuit section with a resist pattern 307 having openings in parts corresponding to the n-type MIS formation regions in the SRAM section and the logic circuit section as a mask to form a SRAM section n-type gate electrode formation film 308 and a logic circuit section n-type gate electrode formation film 309. Then, the resist pattern 307 is removed.

Thereafter, as shown in FIG. 6C, a p-type impurity, such as boron or the like is implanted to the gate electrode formation film 306 on each of the p-type MIS formation regions in the SRAM section and the logic circuit section with the use of a resist pattern 301 having openings in parts corresponding to the p-type MIS formation regions in the SRAM section and the logic circuit section as a mask to form a SRAM section p-type gate electrode formation film 311 and a logic circuit section p-type gate electrode formation film 312. Then, the resist pattern 310 is removed.

Referring herein to the case employing a combination of polysilicon electrodes and a gate insulating film made of a SiON, when the impurity concentration of an n-type gate electrode composing an n-type MIS transistor is increased, the transistor characteristics of the n-type MIS transistor is improved effectively. In contrast, even when the impurity concentration of a p-type gate electrode composing a p-type MIS transistor is increased, the transistor characteristics of the p-type MIS transistor is not improved and the reliability of the gate insulating film composing the p-type MIS transistor may lower.

To tackle this problem, conditions for implanting phosphorous in the step of implanting the n-type impurity to the n-type gate electrode formation films 308, 309 (see FIG. 6B) and conditions for implanting boron in the step of implanting the p-type impurity to the p-type gate electrode formation films 311, 312 (see FIG. 6C) are adjusted so that the phosphorous concentration of the n-type gate electrode formation films 308, 309 is two times or more the boron concentration of the p-type gate electrode formation films 311, 312.

Next, as shown in FIG. 7A, patterning is performed on the SRAM section n-type gate electrode formation film 308, the SRAM section p-type gate electrode formation film 311, the logic circuit section n-type gate electrode formation film 309, and the logic circuit section p-type gate electrode formation film 312 to form a SRAM section n-type gate electrode 308A, a SRAM section p-type gate electrode 311A, a logic circuit section n-type gate electrode 309A, and a logic circuit section p-type gate electrode 312A. Wherein, the SRAM section n-type gate electrode 308A is formed integrally with the SRAM section p-type electrode 312A while the logic circuit section n-type gate electrode 309A is formed integrally with the logic circuit section p-type gate electrode 312A, as shown in FIG. 7A.

Subsequently, as shown in FIG. 7B, extension regions (not shown), sidewalls (not shown), and source/drain regions (not shown) which compose the respective conductivity type MIS transistors are formed by known techniques self-alignedly.

In thermal treatment, such as annealing for activating the source/drain regions and the like, the phosphorous in the SRAM section n-type gate electrode 308A and the boron in the SRAM section p-type gate electrode 311A diffuse mutually in the integrally-formed n-type and p-type gate electrodes 308A, 311A in the SRAM section. As well, the phosphorous in the logic circuit section n-type gate electrode 309A and the boron in the logic circuit section p-type gate electrode 312A diffuse mutually in the integrally-formed n-type and p-type gate electrodes 309A, 312A in the logic circuit section.

The diffusion rate of phosphorous is higher than the diffusion rate of boron in general. Therefore, the amount of the phosphorous that diffuses from the respective n-type gate electrodes 308A, 309A toward the respective p-type gate electrodes 311A, 312A is larger than the amount of the boron that diffuses from the respective p-type gate electrodes 311A, 312B toward the respective n-type gate electrodes 308A, 309A.

For this reason, the pn boundary between the SRAM section n-type gate electrode 308A and the SRAM section p-type gate electrode 311A shifts toward the SRAM section p-type gate electrode 311A (see an arrow Ds in FIG. 7B) while the pn boundary between the logic circuit section n-type gate electrode 309A and the logic circuit section p-type gate electrode 312A shifts toward the logic circuit section p-type gate electrode 312A (see an arrow D1 in FIG. 7B)

Thus formed on the semiconductor substrate 300 in the SRAM section are, as shown in FIG. 7B: a SRAM section n-type MIS transistor including the SRAM section n-type gate electrode 308B formed with the SRAM section gate insulating film 304 interposed and a SRAM section p-type MIS transistor including the SRAM section p-type gate electrode 311B formed with the SRAM section gate insulating film 304 interposed. As well, there are formed on the semiconductor substrate 300 in the logic circuit section: a logic circuit section n-type MIS transistor including the logic circuit section n-type gate electrode 309B formed with the logic circuit section gate insulating film 305 interposed and a logic circuit section p-type MIS transistor including the logic circuit section p-type gate electrode 312B with the logic circuit section gate insulating film 305 interposed.

In the semiconductor device in the conventional example, as shown in FIG. 7B, in the SRAM section, which is comparatively small in width of the element isolation between the n-type MIS transistor and the p-type MIS transistor, the pn boundary between the SRAM section n-type gate electrode 308B and the SRAM section p-type gate electrode 311B shifts over the element isolation region 301 to reach a point on the SRAM section gate insulating film 304 located on the SRAM section n-type well region 302. This disables securing of the transistor characteristics of the SRAM section p-type MIS transistor.

On the other hand, as shown in FIG. 7B, in the logic circuit section, which is comparatively large in width of the element isolation between the n-type MIS transistor and the p-type MIS transistor, the pn boundary between the logic circuit section n-type gate electrode 309B and the logic circuit section p-type gate electrode 312B remains on the element isolation region 301.

Particularly, in the case employing a combination of polysilicon electrodes and a gate insulating film made of SiON, the n-type gate electrode formation films 308, 309 are formed so as to have high phosphorous concentration (two times or more the boron concentration of the p-type gate electrode formation films 311, 312, for example) for the purpose of improving the transistor characteristics of the n-type MIS transistors, and therefore, the amount of phosphorous that diffuses from the respective n-type gate electrodes 308A, 309a toward the respective p-type gate electrodes 311A, 312A may be more larger than the amount of boron that diffuses from the respective p-type gate electrodes 311A, 312A toward the respective n-type gate electrodes 308A, 309A.

For this reason, in the SRAM section of the semiconductor device of the conventional example, which is comparatively small in width of the element isolation between the n-type MIS transistor and the p-type MIS transistor, the width of the element isolation must be increased to prevent the pn boundary between the SRAM section n-type gate electrode 308B and the SRAM section p-type gate electrode 311B from reaching a point on the SRAM section gate insulating film 304 located on the SRAM section n-type well region 302.

However, when the width of the element isolation between the SRAM section n-type MIS transistor and the SRAM section p-type MIS transistor is increased for the purpose of securing the transistor characteristics of the SRAM section n-type MIS transistor and the SRAM section p-type MIS transistor, the SRAM section increases in area to increase the area of the semiconductor chip.

In sum, in the semiconductor device of the conventional example, though the transistor characteristics of the logic circuit section n-type MIS transistor and the logic circuit section p-type MIS transistor can be improved, the transistor characteristics of the SRAM section n-type MIS transistor and the SRAM section p-type MIS transistor cannot be improved and secured on the contrary. In addition, in order to secure the transistor characteristics of the SRAM section n-type MIS transistor and the SRAM section p-type MIS transistor in the semiconductor device of the conventional example, the width of the element isolation between the SRAM section n-type MIS transistor and the SRAM section p-type MIS transistor must be increased.

SUMMARY OF THE INVENTION

In view of the foregoing, the present invention has its object of, in a semiconductor device including a SRAM section and a logic circuit section, improving transistor characteristics of a logic circuit section n-type MIS transistor and a logic circuit section p-type MIS transistor and securing transistor characteristics of a SRAM section n-type MIS transistor and a SRAM section p-type transistor with no increase in width of an element isolation between the SRAM section n-type MIS transistor and the SRAM section p-type MIS transistor invited.

To achieve the above object, a semiconductor device in accordance with one aspect of the present invention includes: a first n-type MIS transistor including a first n-type gate electrode formed with a first gate insulating film interposed on a first element formation region of a semiconductor substrate in the SRAM section; and a second n-type MIS transistor including a second n-type gate electrode formed with a second gate insulating film interposed on a second element formation region of the semiconductor substrate in the logic circuit section, wherein a first impurity concentration of a first n-type impurity in the first n-type gate electrode is lower than a second impurity concentration of a second n-type impurity in the second n-type gate electrode. It is preferable to further includes: a first p-type MIS transistor including a first p-type gate electrode formed with a third gate insulating film interposed on a third element formation region of the semiconductor substrate in the SRAM section; and a first element isolation region formed between the first element formation region and the third element formation region of the semiconductor substrate, wherein the first n-type gate electrode is integrally formed with the first p-type gate electrode.

In the semiconductor device in accordance with the above aspect of the present invention, the first impurity concentration of the first n-type impurity in the first n-type gate electrode composing the first n-type MIS transistor in the SRAM section is lower than the second impurity concentration of the second n-type impurity in the second n-type gate electrode composing the second n-type MIS transistor in the logic circuit section.

Accordingly, in the SRAM section, in which the first n-type gate electrode is formed integrally with the first p-type gate electrode composing the first p-type MIS transistor, the first n-type impurity in the first n-type gate electrode less diffuses toward the first p-type gate electrode, so that the pn boundary between the first n-type gate electrode and the first p-type gate electrode is prevented from reaching a point on the third gate insulating film in the third element formation region over the first element isolation region. As a result, the transistor characteristics of the first n-type MIS transistor and the first p-type MIS transistor are secured.

This eliminates the need to increase the width of the element isolation between the first n-type MIS transistor and the first p-type MIS transistor in the SRAM section for the purpose of securing the transistor characteristics the first n-type MIS transistor and the first p-type MIS transistor therein, which results in minimization of the width of the element isolation there between, leading to reduction in area of the SRAM cells.

In the semiconductor device in accordance with the aspect of the present invention, it is preferable that a third impurity concentration of a p-type impurity in the first p-type gate electrode is lower than the first impurity concentration.

In the semiconductor device in accordance with the aspect of the present invention, it is preferable that a pn boundary between the first n-type gate electrode and the first p-type gate electrode is located at a point on the first element isolation region.

In the semiconductor device in accordance with the aspect of the present invention, it is preferable to further includes: a second p-type MIS transistor including a second p-type gate electrode formed with a fourth gate insulting film interposed on a fourth element formation region of the semiconductor substrate in the logic circuit section; and a second element isolation region formed between the second element formation and the fourth element formation region of the semiconductor substrate, wherein the second n-type gate electrode is formed integrally with the second p-type gate electrode.

This increases the impurity concentration of the second n-type gate electrode composing the second n-type MIS transistor and the impurity concentration of the second p-type gate electrode composing the second p-type MIS transistor in the logic circuit section while the transistor characteristics of the first n-type MIS transistor and the first p-type MIS transistor are secured in the SRAM section with no increase in width of the element isolation between the first n-type MIS transistor and the first p-type MIS transistor invited therein.

Hence, the transistor characteristics of the second n-type MIS transistor and the second p-type MIS transistor can be improved in the logic circuit section while the width of the element isolation between the first n-type MIS transistor and the first p-type MIS transistor is minimized in the SRAM section.

In the semiconductor device in accordance with the aspect of the present invention, it is preferable that a pn boundary between the second n-type gate electrode and the second p-type gate electrode is located at a point on the second element isolation region.

In the semiconductor device in accordance with the aspect of the present invention, it is preferable that the first element isolation region has a width in a gate width direction smaller than the second element isolation region.

In the semiconductor device in accordance with the aspect of the present invention, it is preferable that the first n-type gate electrode has a width in a gate width direction smaller than the second n-type gate electrode.

In the semiconductor device in accordance with the aspect of the present invention, it is preferable that the first gate insulating film and the second gate insulating film are formed of a same insulting film.

In the semiconductor device in accordance with the aspect of the present invention, it is preferable that the first n-type gate electrode and the second n-type gate electrode are polysilicon electrodes.

To attain the above described object, a semiconductor device manufacturing method in accordance with a first aspect of the present invention includes the steps of: (a) forming a first gate insulating film on a first element formation region of a semiconductor substrate in a SRAM section while forming a second gate insulating film on a second element formation region of the semiconductor substrate in a logic circuit section; (b) forming gate electrode formation films on the first gate insulating film and the second gate insulating film; (c) forming a first n-type gate electrode formation film by introducing a first n-type impurity at a first impurity concentration to the gate electrode formation film on the first element formation region; (d) forming a second n-type gate electrode formation film by introducing a second n-type impurity at a second impurity concentration higher than the first impurity concentration to the gate electrode formation film on the second element formation region; (e) forming, after the step (c) and the step (d), a first n-type gate electrode and a second n-type gate electrode by patterning the first n-type gate electrode formation film and the second n-type gate electrode formation film; and (f) performing, after the step (e), thermal treatment to diffuse the first n-type impurity contained in the first n-type gate electrode and the second n-type impurity contained in the second n-type gate electrode.

In the semiconductor device manufacturing method in accordance with the first aspect of the present invention, the first n-type impurity is introduced at the first impurity concentration to the gate electrode formation film on the first element formation region in the SRAM section to form the first n-type gate electrode formation film. As well, the second n-type impurity is introduced at the second impurity concentration higher than the first impurity concentration to the gate electrode formation film on the second element formation region in the logic circuit section to form the second n-type gate electrode formation film. Accordingly, the first n-type gate electrode and the second n-type gate electrode can be formed so that the impurity concentration of the first n-type impurity in the first n-type gate electrode in the SRAM section is lower than that of the second n-type impurity in the second n-type gate electrode in the logic circuit section.

In the semiconductor device manufacturing method in accordance with the first aspect of the present invention, it is preferable to further includes the step of (g) forming, before the step (a), a first element isolation region in the semiconductor substrate in the SRAM section, the first element isolation region separating the first element formation region and a third element formation region, wherein the step (a) includes the step of forming a third gate insulating film on the third element formation region, and the step (b) includes the step of forming the gate electrode formation film on the third gate insulating film, and the method further includes the step of (h) forming, after the step (b) and before the step (e), a first p-type gate electrode formation film by introducing a first p-type impurity at a third impurity concentration to the gate electrode formation film on the third element formation region, wherein the step (e) includes the step of forming a first p-type gate electrode by patterning a first p-type gate electrode formation film, the step (f) includes the step of diffusing the first p-type impurity contained in the first p-type gate electrode, and in the step (e), the first n-type gate electrode formation film and the first p-type gate electrode formation film are patterned so that the first n-type gate electrode and the first p-type gate electrode are formed integrally with each other.

The thus formed first n-type gate electrode has low impurity concentration of the first n-type impurity (specifically, lower than the impurity concentration of the second n-type impurity in the second n-type gate electrode).

Accordingly, in the thermal treatment, the first n-type impurity in the first n-type gate electrode less diffuses toward the first p-type gate electrode in the integrally-formed first n-type and p-type gate electrodes in the SRAM section, so that the pn boundary between the first n-type gate electrode and the first p-type gate electrode is prevented from reaching a point on the third gate insulating film in the third element formation region over the first element isolation region. This secures the transistor characteristics of the first n-type MIS transistor including the first n-type gate electrode and the first p-type MIS transistor including the first p-type gate electrode.

Hence, in contrast to the conventional example, it is unnecessary to increase the width of the element isolation between the first n-type MIS transistor and the first p-type MIS transistor for the purpose of securing the transistor characteristics of the first n-type MIS transistor and the first p-type MIS transistor in the SRAM section, leading to minimization of the width of the element isolation there between to thus reduce the area of the SRAM cells.

In the semiconductor device manufacturing method in accordance with the first aspect of the present invention, it is preferable that a pn boundary between the first n-type gate electrode and the first p-type gate electrode after the thermal treatment in the step (f) is located at a point on the first element isolation region.

In the semiconductor device manufacturing method in accordance with the first aspect of the present invention, it is preferable that the step (g) includes the step of forming a second element isolation region in the semiconductor substrate in the logic circuit section, the second element isolation region separating the second element formation region and a fourth element formation region, the step (a) includes the step of forming a fourth gate insulting film on the fourth element formation region, and the step (b) includes the step of forming the gate electrode formation film on the fourth gate insulating film, and the method further comprising the step of: (i) forming, after the step (b) and before the step (e), a second p-type gate electrode formation film by introducing a second p-type impurity at a fourth impurity concentration to the gate electrode formation film on the fourth element formation region, wherein the step (e) includes the step of forming a second p-type gate electrode by patterning the second p-type gate electrode formation film, the step (f) includes the step of diffusing the second p-type impurity contained in the second p-type gate electrode, and in the step (e), the second n-type gate electrode formation film and the second p-type gate electrode formation film are patterned so that the second n-type gate electrode and the second p-type gate electrode are formed integrally with each other.

With the above arrangement, the transistor characteristics of the first n-type MIS transistor and the first p-type MIS transistor are secured in the SRAM section with no increase in width of the element isolation between the first n-type MIS transistor and the first p-type MIS transistor invited therein, and the impurity concentration of the second n-type impurity in the second n-type gate electrode composing the second n-type MIS transistor and the impurity concentration of the second p-type impurity in the second p-type gate electrode composing the second p-type MIS transistor can be increased in the logic circuit section.

Hence, the transistor characteristics of the second n-type MIS transistor and the second p-type MIS transistor can be improved in the logic circuit section while the width of the element isolation between the first n-type MIS transistor and the first p-type MIS transistor is minimized in the SRAM section.

In the semiconductor device manufacturing method in accordance with the first aspect of the present invention, it is preferable that the step (h) and the step (i) are performed simultaneously, the first p-type impurity is same as the second p-type impurity, and the third impurity concentration is equal to the fourth impurity concentration.

In the semiconductor device manufacturing method in accordance with the first aspect of the present invention, it is preferable that a pn boundary between the second n-type gate electrode and the second p-type gate electrode after the thermal treatment in the step (f) is located at a point on the second element isolation region.

In the semiconductor device manufacturing method in accordance with the first aspect of the present invention, it is preferable that in the step (g), the first element isolation region has a width in a gate width direction smaller than the second element isolation region.

In the semiconductor device manufacturing method in accordance with the first aspect of the present invention, it is preferable that in the step (e), the first n-type gate electrode has a width in a gate width direction smaller than the second n-type gate electrode.

To achieve the above described object, a semiconductor device manufacturing method in accordance with a second aspect of the present invention includes the steps of: (a) forming a first gate insulating film on a first element formation region of a semiconductor substrate in a SRAM section while forming a second gate insulating film on a second element formation region of the semiconductor substrate in a logic circuit section; (b) forming gate electrode formation films on the first gate insulating film and the second gate insulating film; (c) forming a first n-type gate electrode formation film by introducing a first n-type impurity at a first impurity concentration to a part of the gate electrode formation film on the first element formation region which is a region other than a region located on at least one of end parts of the first element formation region so that the first n-type gate electrode formation film is composed of an impurity undoped region located at the one end part thereof and an n-type impurity doped region; (d) forming a second n-type gate electrode formation film by introducing a second n-type impurity at a second impurity concentration to the gate electrode formation film on the second element formation region; (e) forming, after the step (c) and the step (d), a first n-type gate electrode and a second n-type gate electrode by patterning the first n-type gate electrode formation film and the second n-type gate electrode formation film; and (f) performing, after the step (e), thermal treatment to diffuse the first n-type impurity contained in the first n-type gate electrode and the second n-type impurity contained in the second n-type gate electrode.

In the semiconductor device manufacturing method in accordance with the second aspect of the present invention, the first n-type impurity is introduced at the first impurity concentration to only a part of the gate electrode formation film on the first element formation region in the SRAM section to form the first n-type gate electrode formation film. In contrast, the second n-type impurity is introduced at the second impurity concentration to the gate electrode formation film on the second element formation region in the logic circuit section to form the second n-type gate electrode formation film. Accordingly, the impurity concentration of the first n-type impurity in the first n-type gate electrode in the SRAM section is lower than that of the second n-type impurity in the second n-type gate electrode in the logic circuit section.

In the semiconductor device manufacturing method in accordance with the second aspect of the present invention, it is preferable that the step (c) and the step (d) are performed simultaneously, the first n-type impurity is same as the second n-type impurity, and the first impurity concentration is equal to the second impurity concentration.

Accordingly, the first n-type gate electrode and the second n-type gate electrode can be formed so that the impurity concentration of the first n-type impurity in the first n-type gate electrode is lower than that of the second n-type impurity in the second n-type gate electrode with no increase in the number of manufacturing steps invited.

In the semiconductor device manufacturing method in accordance with the second aspect of the present invention, it is preferable to further include the step of: (g) forming, before the step (a), a first element isolation region in the semiconductor substrate in the SRAM section, the first element isolation region separating the first element formation region and a third element formation region, wherein the step (a) includes the step of forming a third gate insulating film on the third element formation region, and the step (b) includes the step of forming the gate electrode formation film on the third gate insulating film, and the method further includes the step of: (h) forming, after the step (b) and before the step (e), a first p-type gate electrode formation film by introducing a first p-type impurity at a third impurity concentration to the gate electrode formation film on the third element formation region, wherein the step (e) includes the step of forming a first p-type gate electrode by patterning the first p-type gate electrode formation film, the step (f) includes the step of diffusing the first p-type impurity contained in the first p-type gate electrode, and in the step (e), the first p-type gate electrode formation region and the first n-type gate electrode formation film, which is composed of the impurity undoped region and the n-type impurity doped region, are patterned so that the first p-type gate electrode and the first n-type gate electrode are formed integrally with each other.

Accordingly, the thus formed n-type gate electrode has low impurity concentration of the first n-type impurity (specifically, lower than the impurity concentration of the second n-type impurity in the second n-type gate electrode).

Whereby, in the SRAM section, in which the first n-type gate electrode is formed integrally with the first p-type gate electrode, the n-type impurity in the first n-type gate electrode less diffuses toward the first p-type gate electrode in the thermal treatment, so that the pn boundary between the first n-type gate electrode and the first p-type gate electrode is prevented from reaching a point on the third gate insulating film of the third element formation region over the first element isolation region. As a result, the transistor characteristics of the first n-type MIS transistor including the first n-type gate electrode and the first p-type MIS transistor including the p-type gate electrode can be secured.

Hence, in contrast to the conventional example, it is unnecessary to increase the width of the element isolation between the first n-type MIS transistor and the first p-type MIS transistor in the SRAM section for the purpose of securing the transistor characteristics of the first n-type MIS transistor and the first p-type MIS transistor therein, leading to minimization of the width of the element isolation between the first n-type MIS transistor and the first p-type MIS transistor to thus reduce the area of the SRAM cells.

In the semiconductor device manufacturing method in accordance with the second aspect of the present invention, it is preferable that a pn boundary between the first n-type gate electrode and the first p-type gate electrode after the thermal treatment in the step (f) is located at a point on the first element isolation region.

In the semiconductor device manufacturing method in accordance with the second aspect of the present invention, it is preferable that the step (g) includes the step of forming a second element isolation region in the semiconductor substrate in the logic circuit section, the second element isolation region separating the second element formation region and a fourth element formation region, the step (a) includes the step of forming a fourth gate insulating film on the fourth element formation region, and the step (b) includes the step of forming the gate electrode formation film on the fourth gate insulating film, and the method further includes the step of (i) forming, after the step (b) and before the step (e), a second p-type gate electrode formation film by introducing a second p-type impurity at a fourth impurity concentration to the gate electrode formation film on the fourth element formation region, wherein the step (e) includes the step of forming a second p-type gate electrode by patterning the second p-type gate electrode formation film, the step (f) includes the step of diffusing the second p-type impurity contained in the second p-type gate electrode, and in the step (e), the second n-type gate electrode formation film and the second p-type gate electrode formation film are patterned so that the second n-type gate electrode and the second p-type gate electrode are formed integrally with each other.

With the above arrangement, the transistor characteristics of the first n-type MIS transistor and the first p-type MIS transistor can be secured in the SRAM section with no increase in width of the element isolation between the first n-type MIS transistor and the first p-type MIS transistor invited therein, and the impurity concentration of the second n-type impurity in the second n-type gate electrode composing the second n-type MIS transistor and the impurity concentration of the second p-type impurity in the second p-type gate electrode composing the second p-type MIS transistor can be increased in the logic circuit section.

Hence, the transistor characteristics of the second n-type MIS transistor and the second p-type MIS transistor can be improved in the logic circuit section while the width of the element isolation between the first n-type MIS transistor and the first p-type MIS transistor is minimized in the SRAM section.

As described above, according to the semiconductor device and the manufacturing methods thereof in accordance with the aspects of the present invention, the transistor characteristics of the first n-type MIS transistor and the first p-type MIS transistor can be secured in the SRAM section with no increase in width of the element isolation between the first n-type MIS transistor and the first p-type MIS transistor invited therein, leading to minimization of the width of the element isolation there between. In addition, the transistor characteristics of the second n-type MIS transistor and the second p-type MIS transistor can be improved in the logic circuit section that determines the operation speed of the semiconductor device.

BRIEF DESCRIPTION OF THE DRAWINGS

FIG. 1A to FIG. 1C are sectional views of a main part showing steps of a semiconductor device manufacturing method in accordance with Embodiment 1 of the present invention.

FIG. 2A and FIG. 2B are sectional views of the main part showing steps of the semiconductor device manufacturing method in accordance with Embodiment 1 of the present invention.

FIG. 5A and FIG. 5B are sectional views of the main part showing steps of the semiconductor device manufacturing method in accordance with Embodiment 2 of the present invention.

DESCRIPTION OF THE PREFERRED EMBODIMENTS

Figure 3A:
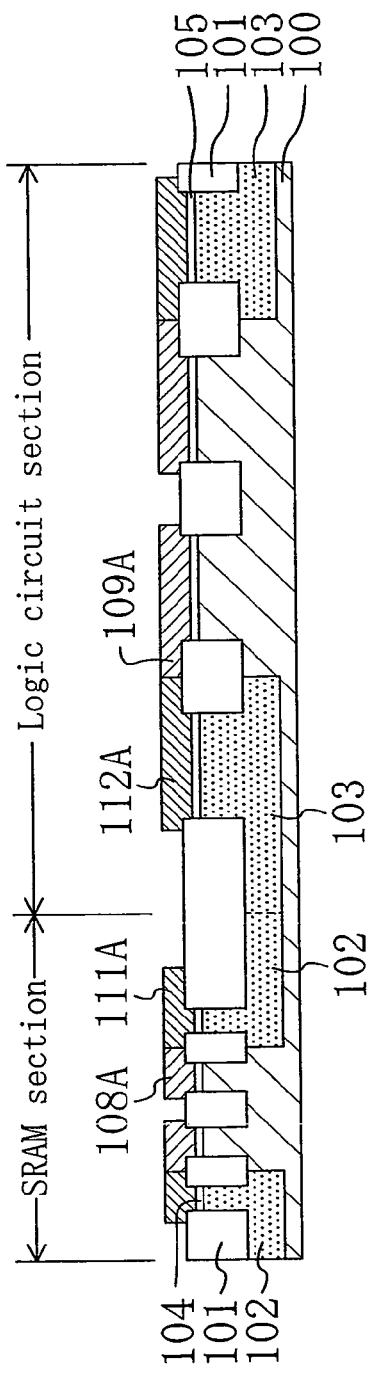
FIG. 3A and FIG. 3B are sectional views of the main part showing steps of the semiconductor device manufacturing method in accordance with Embodiment 1 of the present invention.

Embodiments of the present invention will be described below with reference to the accompanying drawings.

Embodiment 1

A semiconductor device manufacturing method in accordance with Embodiment 1 will be described with reference to FIG. 1A to FIG. 1C, FIG. 2A, FIG. 2B, FIG. 3A, and FIG. 3B, which are sectional views of a main part in the gate width direction showing respective steps of the semiconductor device manufacturing method in accordance with Embodiment 1 of the present invention.

First, as shown in FIG. 1A, element isolation regions 101 formed of silicon oxide films buried in trenches are formed by shallow trench isolation (STI) selectively in upper parts of a semiconductor substrate 100 made of p-type silicon. Wherein, the width in the gate width direction of an element isolation region 101, which separates an element formation region of a SRAM section n-type MIS transistor and an element formation region of a SRAM section p-type MIS transistor, is set smaller than the width in the gate width direction of an element isolation region 101, which separates an element formation region of a logic circuit section n-type MIS transistor and an element formation region of a logic circuit section p-type MIS transistor. Then, a SRAM section n-type well region 102 is formed in a p-type MIS formation region of the semiconductor substrate 100 in the SRAM section, and a logic circuit section n-type well region 103 is formed in a p-type MIS formation region of the semiconductor substrate 100 in the logic circuit section.

Next, a SRAM section gate insulating film 104 formed of a SiON (silicon oxynitride) film having a thickness of 1.7 nm is formed in an element formation region (an active region) of the semiconductor substrate 100 which is surrounded by the element isolation regions 101 in the SRAM section. As well, a logic circuit section gate insulating film 105 formed of a SiON film having a thickness of 1.7 nm is formed in an element formation region (an active region) of the semiconductor substrate 100 which is surrounded by the element isolation regions 101 in the logic circuit section. Then, low pressure CVD is performed to form a gate electrode formation film 106 formed of a polysilicon film having a thickness of 100 nm on the entirety of the semiconductor substrate 100.

Subsequently, as shown in FIG. 1B, an n-type impurity, for example, phosphorous or the like is implanted to the gate electrode formation film 106 on the n-type MIS formation region in the logic circuit section with the use of a resist pattern 107a having an opening in a part corresponding to the n-type MIS formation region in the logic circuit section as a mask to form a logic circuit section n-type gate electrode formation film 109. Then, the resist pattern 107a is removed. Herein, the n-type impurity implantation (second n-type impurity implantation) with respect to the logic circuit section n-type gate electrode formation film 109 is performed under the conditions of, for example, an implantation energy of 10 keV and a dosage of $8 \times 10^{15}$ atoms/cm$^2$.

Thereafter, as shown in FIG. 1C, a p-type impurity, for example, boron or the like is implanted to the gate electrode formation film 106 on the p-type MIS formation region in the logic circuit section with the use of a resist pattern 110a having an opening in a part corresponding to the p-type MIS formation region in the logic circuit section as a mask to form a logic circuit section p-type gate electrode formation film 112. Then, the resist pattern 110a is removed. Herein, the p-type impurity implantation (fourth p-type impurity implantation) with respect to the logic circuit section p-type gate electrode formation film 112 is performed under the conditions of, for example, an implantation energy of 5 keV and a dosage of $3 \times 10^{15}$ atoms/cm$^2$.

Next, as shown in FIG. 2A, an n-type impurity, for example, phosphorous or the like is implanted to the gate electrode formation film 106 on the n-type MIS formation region in the SRAM section with the use of a resist pattern 107b having an opening in a part corresponding to the n-type MIS formation region in the SRAM section as a mask to form a SRAM section n-type gate electrode formation film 108. Then, the resist pattern 107b is removed. Herein, the n-type impurity implantation (first n-type impurity implantation) with respect to the SRAM section n-type gate electrode formation film 108 is performed under the conditions of, for example, an implantation energy of 10 keV and a dosage of $4 \times 10^{15}$ atms/cm$^2$.

Subsequently, as shown in FIG. 2B, a p-type impurity, for example, boron or the like is implanted to the gate electrode formation film 106 on the p-type MIS formation region in the SRAM section with the use of a resist pattern 110b having an opening in a part corresponding to the p-type MIS formation region in the SRAM section as a mask to form a SRAM section p-type gate electrode formation film 111. Then, the resist pattern 107b is removed. Herein, the p-type impurity implantation (third p-type impurity implantation) with respect to the SRAM section p-type gate electrode formation film 111 is performed under the conditions of, for example, an implantation energy of 5 keV and a dosage of $2 \times 10^{15}$ atms/cm$^2$.

The conditions for each conductivity type impurity implantation are listed below.
Conditions for the second n-type impurity implantation
   Second implantation energy: 10 keV
   Second dosage: $8 \times 10^{15}$ atoms/cm$^2$
Conditions for the fourth p-type impurity implantation
   Fourth implantation energy: 5 keV
   Fourth dosage: $3 \times 10^{15}$ atoms/cm$^2$
Conditions for the first n-type impurity implantation
   First implantation energy: 10 keV
   First dosage: $4 \times 10^{15}$ atoms/cm$^2$
Conditions for the third p-type impurity implantation
   Third implantation energy: 5 keV
   Third dosage: $2 \times 10^{15}$ atoms/cm$^2$ Thereafter, patterning is performed on the logic circuit section n-type gate electrode formation film 109, the logic circuit section p-type gate electrode formation film 112, the SRAM section n-type gate electrode formation film 108, and the SRAM section p-type gate electrode formation film 111 to form a logic circuit section n-type gate electrode 109A, a logic circuit section p-type gate electrode 112A, a SRAM section n-type gate electrode 108A, and a SRAM section p-type gate electrode 111A, as shown in FIG. 3A. Wherein, the logic circuit section n-type gate electrode 109A is formed integrally with the logic circuit section p-type gate electrode 112A while the SRAM section n-type gate electrode 108A is formed integrally with the SRAM section p-type gate electrode 111A, as shown in FIG. 3A. Further, the SRAM section n-type gate electrode 108A and the SRAM section p-type gate electrode 111A have widths in the gate width direction smaller than the logic circuit section n-type gate electrode 109A and the logic circuit section p-type gate electrode 112A, respectively.

Figure 3B:
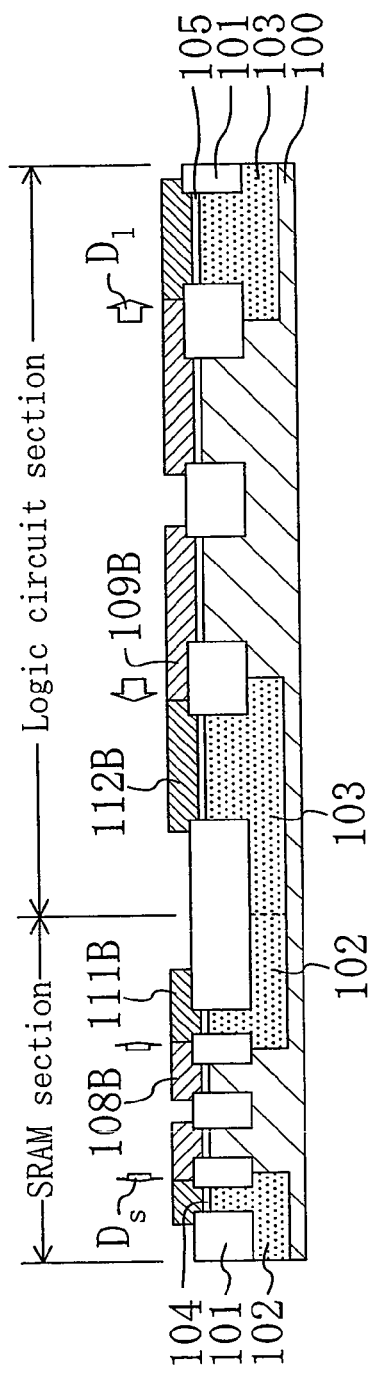

Next, as shown in FIG. 3B, extension regions (not shown), sidewalls (not shown), and source/drain regions (not shown) which compose the respective conductivity type MIS transistors are formed self-alignedly by known techniques.

In thermal treatment of, for example, annealing for activating the source/drain regions, the phosphorous in the logic circuit section n-type gate electrode 109A and the boron in the logic circuit section p-type gate electrode 112A diffuse mutually in the integrally-formed logic circuit section n-type and p-type gate electrodes 109A, 112A while the phosphorous in the SRAM section n-type gate electrode 108A and the boron in the SRAM section p-type gate electrode 111A diffuse mutually in the integrally formed SRAM section n-type and p-type gate gate electrodes 108A, 111A.

In general, the diffusion rate of phosphorous is larger than the diffusion rate of boron. For this reason, the phosphorous in the respective n-type gate electrodes 109A, 108A diffuses toward the respective p-type gate electrodes 112A, 111A more than the boron in the respective p-type gate electrodes 112A, 111A diffuses toward the respective n-type gate electrodes 109A, 108A.

Accordingly, the pn boundary between the logic circuit section n-type gate electrode 109A and the logic circuit section p-type gate electrode 112A shifts toward the logic circuit section p-type gate electrode 112A (see an arrow D1 in FIG. 3B) while the pn boundary between the SRAM section n-type gate electrode 108A and the SRAM section p-type gate electrode 111A shifts toward the SRAM section p-type gate electrode 111A (see an arrow Ds in FIG. 3B).

Thus, as shown in FIG. 3B, the logic circuit section n-type MIS transistor and the logic circuit section p-type MIS transistor are formed on the semiconductor substrate 100 in the logic circuit section. The logic circuit section n-type MIS transistor includes the logic circuit section n-type gate electrode 109B formed with the logic circuit section gate insulating film 105 interposed while the logic circuit section p-type MIS transistor includes the logic circuit section p-type gate electrode 112B formed with the logic circuit section gate insulating film 105 interposed. On the other hand, the SRAM section n-type MIS transistor and the SRAM section p-type MIS transistor are formed on the semiconductor substrate 100 in the SRAM section. The SRAM section n-type MIS transistor includes the SRAM section n-type gate electrode 108B formed with the SRAM section gate insulating film 104 interposed while the SRAM section p-type MIS transistor includes the SRAM section p-type gate electrode 111B formed with the SRAM section gate insulating film 104 interposed. Wherein, the pn boundary between the logic circuit section n-type gate electrode 109B and the logic circuit section p-type gate electrode 112B is located at a point on the element isolation region 101 between the element formation region of the logic circuit section n-type MIS transistor and the element formation region of the logic circuit section p-type MIS transistor. As well, the pn boundary between the SRAM section n-type gate electrode 108B and the SRAM section p-type gate electrode 111B is located at a point on the element isolation region 101 between the element formation region of the SRAM section n-type MIS transistor and the element formation region of the SRAM section p-type MIS transistor.

Thus, the semiconductor device in accordance with the present embodiment is manufactured.

In the present embodiment, the first dosage of phosphorous implanted to the SRAM section n-type gate electrode formation film 108 is set smaller (for example, $4 \times 10^{15}$ atms/cm$^2$) than the second dosage of phosphorous implanted to the logic circuit section n-type gate electrode formation film 109 (for example, $8 \times 10^{15}$ atoms/cm$^2$) so that the phosphorous concentration of the SRAM section n-type gate electrode 108B is lower than the phosphorous concentration of the logic circuit section n-type gate electrode 109B.

This reduces the distance that the ph boundary between the SRAM section n-type gate electrode 108B and the SRAM section p-type gate electrode 111B shifts (see the arrow Ds in FIG. 3B) when compared with the distance that the ph boundary between the logic circuit section n-type gate electrode 109B and the logic circuit section p-type gate electrode 112B shifts (see the arrow D1 in FIG. 3B).

The distance Ds means a distance from the pn boundary between the SRAM section n-type gate electrode 108A and the SRAM section p-type gate electrode 111A before annealing for activating the source/drain regions to the pn boundary there between after the annealing therefor. Similarly, the distance Dl means a distance from the pn boundary between the logic circuit section n-type gate electrode 109A and the logic circuit section p-type gate electrode 112A before annealing for activating the source/drain regions to the pn boundary there between after the annealing therefor.

The reduction in distance prevents excessive diffusion of the phosphorous in the SRAM section n-type gate electrode 108A toward the SRAM section p-type gate electrode 111A to prevent the pn boundary between the SRAM section n-type gate electrode 108B and the SRAM section p-type gate electrode 111B from reaching a point on the SRAM section gate insulating film 104 located on the SRAM section n-type well 202 over the element isolation region 101. Hence, the transistor characteristics of the SRAM section n-type MIS transistor and the SRAM section p-type MIS transistor can be secured.

Accordingly, in contrast to the conventional example, it is unnecessary to increase the width of the element isolation between the SRAM section n-type MIS transistor and the SRAM section p-type MIS transistor for the purpose of securing the transistor characteristics of the SRAM section n-type MIS transistor and the SRAM section p-type MIS transistor, which leads to minimization of the width of the element isolation there between, resulting in reduction in area of the SRAM cells.

In addition, the impurity concentration of the logic circuit section n-type gate electrode 109B and the impurity concentration of the logic circuit section p-type gate electrode 112B can be increased while the transistor characteristics of the SRAM section n-type MIS transistor and the SRAM section p-type MIS transistor are secured with no increase in width of the element isolation between the SRAM section n-type MIS transistor and the SRAM section p-type MIS transistor invited.

As a result, the transistor characteristics of the logic circuit section n-type MIS transistor and the logic circuit section p-type MIS transistor can be improved while the width of the element isolation between the SRAM section n-type MIS transistor and the SRAM section p-type MIS transistor is minimized.

As described above, according to the present embodiment, the dosage of the n-type impurity with respect to the SRAM section n-type gate electrode formation film 108 is set smaller than the dosage of the n-type impurity with respect to the logic circuit section n-type gate electrode formation film 108, so that the width of the element isolation between the SRAM section n-type MIS transistor and the SRAM section p-type MIS transistor is minimized. Further, the transistor characteristics of the logic circuit section n-type MIS transistor and the logic circuit section p-type MIS transistor can be improved in the logic circuit section that determines the operation speed of the semiconductor device.

It is noted that though the implantation steps are performed separately in Embodiment 1 as the second n-type impurity implantation with respect to the logic circuit section n-type gate electrode formation film 109 (see FIG. 1B), the fourth p-type impurity implantation with respect to the logic circuit section p-type gate electrode formation film 112 (see FIG. 1C), the first n-type impurity implantation with respect to the SRAM section n-type gate electrode formation film 108 (see FIG. 2A), and the third p-type impurity implantation with respect to the SRAM section p-type gate electrode formation film 111 (see FIG. 2B), the present invention is not limited thereto.

For example, for reducing the number of the semiconductor device manufacturing steps, the fourth p-type impurity implantation with respect to the logic circuit section p-type gate electrode formation film 112 may be performed simultaneously with the third p-type impurity implantation with respect to the SRAM section p-type gate electrode formation film 111.

Embodiment 2

A semiconductor device manufacturing method in accordance with Embodiment 2 will be described below with reference to FIG. 4A to FIG. 4C, FIG. 5A, and FIG. 5B, which are sectional views of a main part in the gate width direction showing respective steps of the semiconductor device manufacturing method in accordance with Embodiment 2 of the present invention.

Figure 4A:
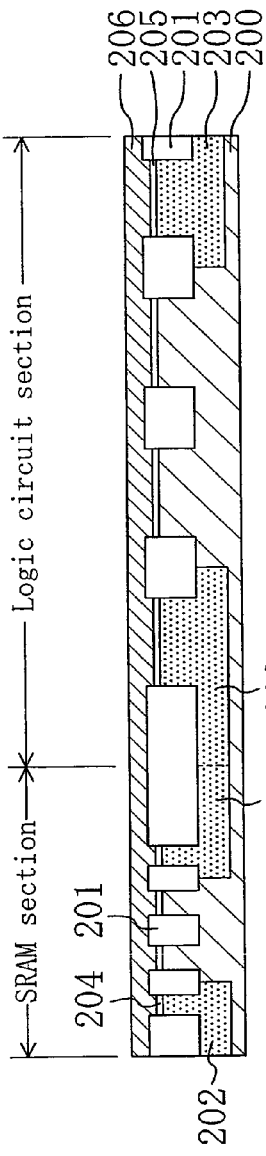
FIG. 4A to FIG. 4C are sectional views of a main part showing steps of a semiconductor device manufacturing method in accordance with Embodiment 2 of the present invention.

First, as shown in FIG. 4A, element isolation regions 201 formed of silicon oxide films buried in trenches are formed by shallow trench isolation (STI) selectively in upper parts of a semiconductor substrate 200 made of p-type silicon. Wherein, the width in the gate width direction of an element isolation region 201, which separates an element formation region of a SRAM section n-type MIS transistor and an element formation region of a SRAM section p-type MIS transistor, is set smaller than the width in the gate width direction of an element isolation region 201, which separates an element formation region of a logic circuit section n-type MIS transistor and an element formation region of a logic circuit section p-type MIS transistor. Then, a SRAM section n-type well region 202 is formed in a p-type MIS formation region of the semiconductor substrate 200 in the SRAM section, and a logic circuit section n-type well region 203 is formed in a p-type MIS formation region of the semiconductor substrate 200 in the logic circuit section.

Next, a SRAM section gate insulating film 204 formed of a SiON (silicon oxynitride) film having a thickness of 1.7 nm is formed in an element formation region (an active region) of the semiconductor substrate 200 which is surrounded by the element isolation regions 201 in the SRAM section. As well, a logic circuit section gate insulating film 205 formed of a SiON film having a thickness of 1.7 nm is formed in an element formation region (an active region) of the semiconductor substrate 200 which is surrounded by the element isolation regions 201 in the logic circuit section. Then, low pressure CVD is performed to form a gate electrode formation film 206 formed of a polysilicon film having a thickness of 100 nm on the entirety of the semiconductor substrate 200.

Figure 4B:
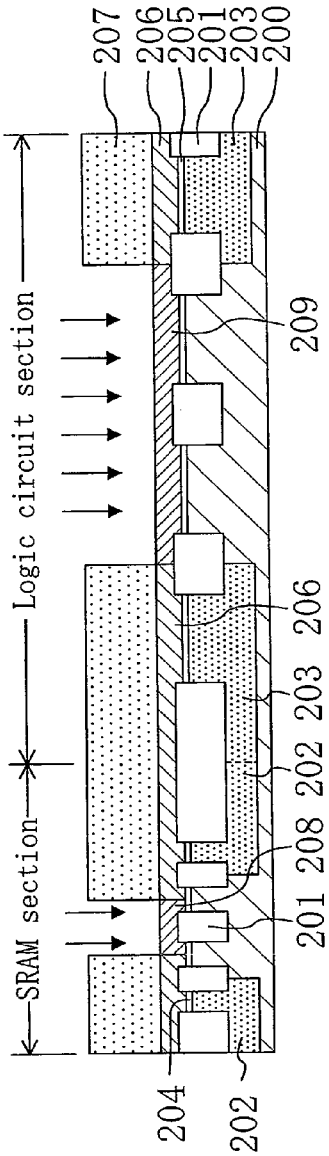

Subsequently, as shown in FIG. 4B, an n-type impurity, for example, phosphorous or the like is implanted to a part of the gage electrode formation film 206 on the n-type MIS formation region in the SRAM section and the gate electrode formation film 206 on the n-type MIS formation region in the logic circuit section with the use of a resist pattern 207 having openings in parts corresponding the part of the n-type MIS formation region in the SRAM section and the n-type MIS formation region in the logic circuit section as a mask to form a SRAM section n-type gate electrode formation film 208 and a logic circuit section n-type gate electrode formation film 209. Then, the resist pattern 207 is removed. Herein, the n-type impurity implantation (first n-type impurity implantation) with respect to the SRAM section n-type gate electrode formation film 208 and the n-type impurity implantation (second n-type impurity implantation) with respect to the logic circuit section n-type gate electrode formation film 209 are performed under the conditions of, for example, an implantation energy of 10 keV and a dosage of $8 \times 10^{15}$ atoms/cm². In this way, in the present embodiment, the first n-type impurity is implanted to only a part of the gate electrode formation film 206 on the n-type MIS formation region in the SRAM section.

Figure 4C:
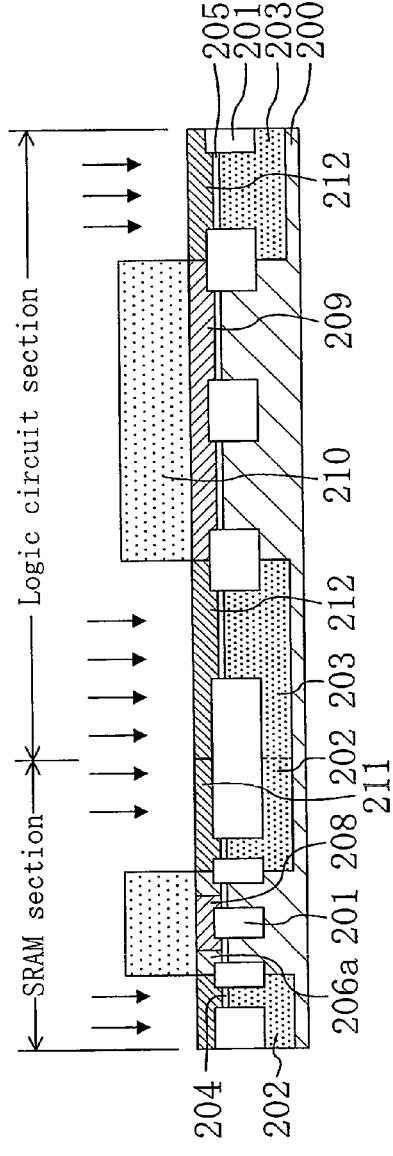
Figure 6A:
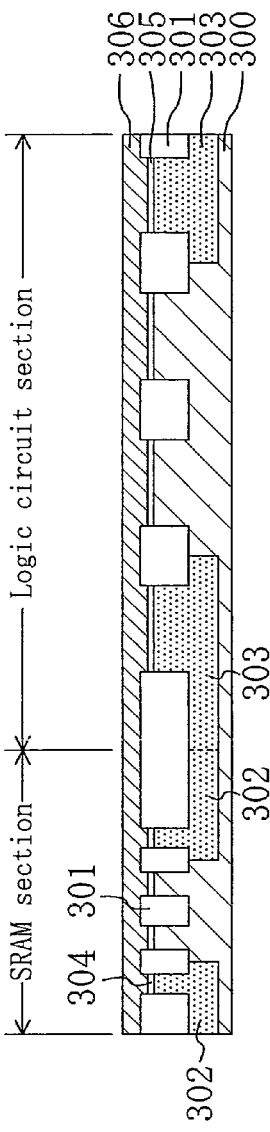
FIG. 6A to FIG. 6C are sectional views of a main part showing steps of a conventional semiconductor device manufacturing method.
Figure 6B:
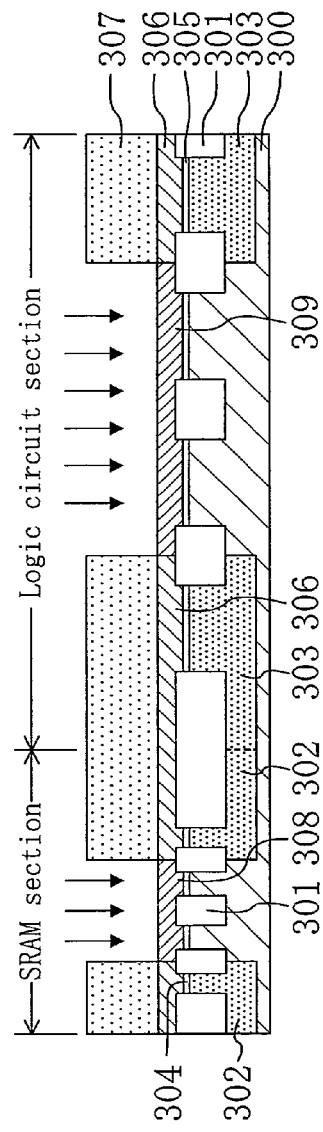
Figure 6C:
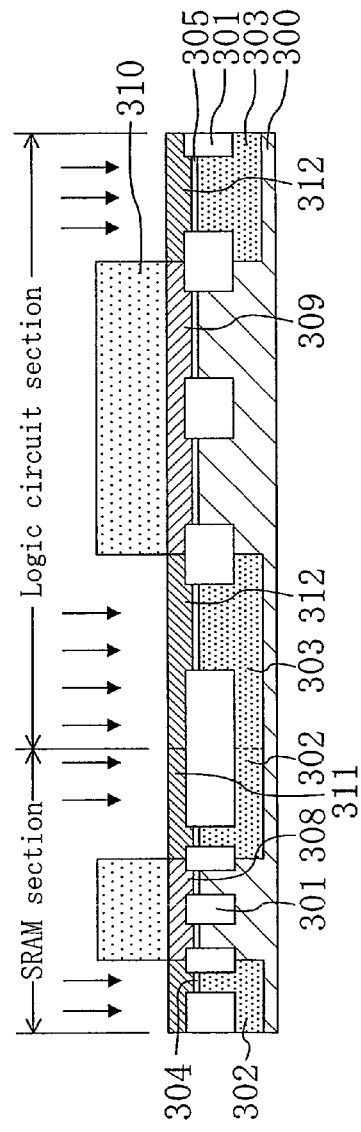
Figure 7A:
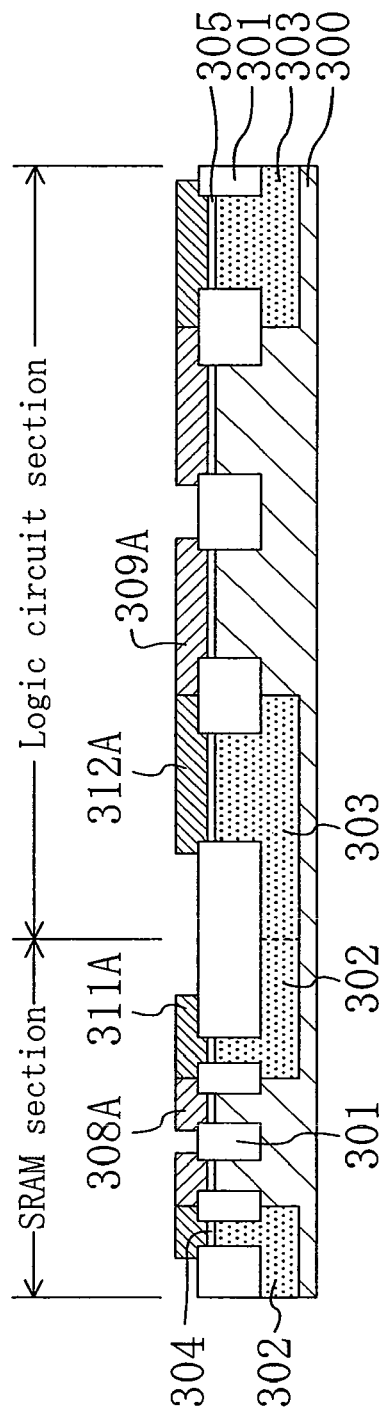
FIG. 7A and FIG. 7B are sectional views of the main part showing steps of the conventional semiconductor device manufacturing method.
Figure 7B:
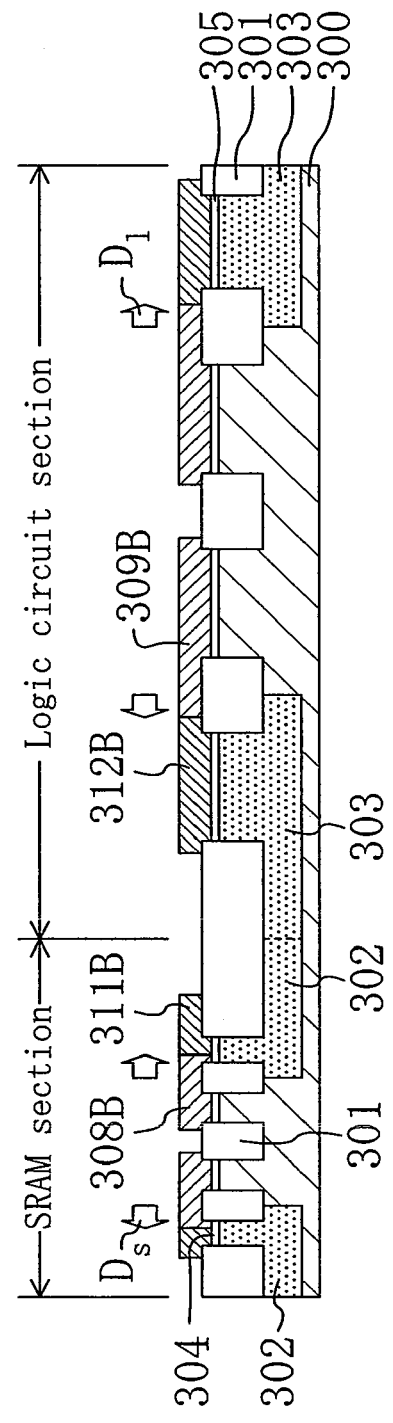

Thereafter, as shown in FIG. 4C, a p-type impurity, for example, boron or the like is implanted to the gate electrode formation film 206 on the p-type MIS formation region in the SRAM section and the gate electrode formation film 206 on the p-type MIS formation region in the logic circuit section with the use of a resist pattern 210 having openings in parts corresponding to the p-type MIS formation regions in the SRAM section and the logic circuit section as a mask to form a SRAM section p-type gate electrode formation film 211 and a logic circuit section p-type gate electrode formation film 212. Then, the resist pattern 210 is removed. Wherein, the p-type impurity implantation (third p-type impurity implantation) with respect to the SRAM section p-type gate electrode film 211 and the p-type impurity implantation (fourth p-type impurity implantation) with respect to the logic circuit section p-type gate electrode formation film 212 are performed under the conditions of, for example, an implantation energy of 5 keV and dosage of $3 \times 10^{15}$ atms/cm².

In the present embodiment, the first n-type impurity is implanted to only a part of the gate electrode formation film 206 on the n-type MIS formation region in the SRAM section in the step shown in FIG. 4B so that an undoped SRAM section gate electrode formation film 206a intervenes between the SRAM section p-type gate electrode formation film 211 and the SRAM section n-type gate electrode formation film 208, as shown in FIG. 4C.

Conditions for each conductivity type impurity implantation are listed below.
Conditions for the first n-type impurity implantation
 First implantation energy: 10 keV
 First dosage: $8 \times 10^{15}$ atoms/cm²
Conditions for the second n-type impurity implantation
 Second implantation energy: 10 keV
 Second dosage: $8 \times 10^{15}$ atoms/cm²
Conditions for the third p-type impurity implantation
 Third implantation energy: 5 keV
 Third dosage: $3 \times 10^{15}$ atoms/cm²
Conditions for the fourth p-type impurity implantation
 Fourth implantation energy: 5 keV
 Fourth dosage: $3 \times 10^{15}$ atoms/cm²

Thereafter, as shown in FIG. 5A, patterning is performed on the undoped SRAM section gate electrode formation film 206a, the SRAM section n-type gate electrode formation film 208, the SRAM section p-type gate electrode formation film 211, the logic circuit section n-type gate electrode formation film 209, and the logic circuit section p-type gate electrode formation film 212 to form a SRAM section n-type gate electrode 208A, a SRAM section p-type gate electrode 211A, a logic circuit section n-type gate electrode 209A and, a logic circuit section p-type gate electrode 212A.

Wherein, as shown in FIG. 5A, the SRAM section n-type gate electrode 208A includes an n-type impurity doped region 208b and an impurity undoped region 206b located adjacently to one of the end parts of the SRAM section p-type gate electrode 211A. Further, the SRAM section n-type gate electrode 208A is formed integrally with the SRAM section p-type gate electrode 211A while the logic circuit section n-type gate electrode 209A is formed integrally with the logic circuit section p-type gate electrode 212A, as shown in FIG. 5A. Moreover, the SRAM section n-type gate electrode 208A and the SRAM section p-type gate electrode 211A have widths in the gate width direction smaller than the logic circuit section n-type gate electrode 209A and the logic circuit section p-type gate electrode 212A, respectively.

Subsequently, as shown in FIG. 5B, extension regions (not shown), sidewalls (not shown), and source/drain regions (not shown) which compose the respective conductivity type MIS transistors are formed self-alignedly by known techniques.

In thermal treatment of, for example, annealing for activating the source/drain regions, the phosphorous in the n-type impurity doped region 208b composing the SRAM section n-type gate electrode 208A and the boron in the SRAM section p-type gate electrode 212A diffuse mutually in the integrally-formed SRAM section n-type and p-type gate electrodes 208A, 211A. Similarly, the phosphorous in the logic circuit section n-type gate electrode 209A and the boron in the logic circuit section p-type gate electrode 212A diffuse mutually in the integrally-formed logic circuit section n-type and p-type gate electrodes 209A, 212A. Herein, RTA treatment is performed as the thermal treatment at a temperature of 900° C. for 30 seconds, for example.

In general, the diffusion rate of phosphorous is larger than the diffusion rate of boron. For this reason, the phosphorous in the respective n-type gate electrodes 208A, 209A diffuses toward the respective p-type gate electrodes 211A, 212A more than the boron in the respective p-type gate electrodes 211A, 212A diffuses toward the respective n-type gate electrodes 208A, 209A.

Accordingly, the pn boundary between the SRAM section n-type gate electrode 208A and the SRAM section p-type gate electrode 211A shifts toward the SRAM section p-type gate electrode 211A (see an arrow Ds in FIG. 5B) while the pn boundary between the logic circuit section n-type gate electrode 209A and the logic circuit section p-type gate electrode 212A shifts toward the logic circuit section p-type gate electrode 212A (see an arrow D1 in FIG. 5B).

Thus, as shown in FIG. 5B, the SRAM section n-type MIS transistor and the SRAM section p-type MIS transistor are formed on the semiconductor substrate 200 in the SRAM section. The SRAM section n-type MIS transistor includes the SRAM section n-type gate electrode 208B formed with the SRAM section gate insulating film 204 interposed while the SRAM section p-type MIS transistor includes the SRAM section p-type gate electrode 211B formed with the SRAM section gate insulating film 204 interposed. On the other hand, the logic circuit section n-type MIS transistor and the logic circuit section p-type MIS transistor are formed on the semiconductor substrate 200 in the logic circuit section. The logic circuit section n-type MIS transistor includes the logic circuit section n-type gate electrode 209B formed with the logic circuit section gate insulating film 205 interposed while the logic circuit section p-type MIS transistor includes the logic circuit section p-type gate electrode 212B formed with the logic circuit section gate insulating film 205 interposed. Wherein, the pn boundary between the logic circuit section n-type gate electrode 209B and the logic circuit section p-type gate electrode 212B is located at a point on the element isolation region 201 between the element formation region of the logic circuit section n-type MIS transistor and the element formation region of the logic circuit section p-type MIS transistor. As well, the pn boundary between the SRAM section n-type gate electrode 208B and the SRAM section p-type gate electrode 211B is located at a point on the element isolation region 201 between the element formation region of the SRAM section n-type MIS transistor and the element formation region of the SRAM section p-type MIS transistor.

Thus, the semiconductor device in accordance with the present embodiment is manufactured.

In the step shown in FIG. 4B in the present embodiment, phosphorous is implanted to the gate electrode formation film 206 on the n-type MIS formation region in the logic circuit section while being implanted to only a part of the gate electrode formation film 206 on the n-type MIS formation region in the SRAM section so that the SRAM section n-type gate electrode 208B has phosphorous concentration lower than the logic circuit section n-type gate electrode 209B.

This allows the phosphorous in the n-type impurity doped region 208b composing the SRAM section n-type gate electrode 208A to diffuse to the impurity undoped region 206b, as shown in FIG. 5B. Accordingly, the phosphorous in the SRAM section n-type gate electrode 208A diffuses to the SRAM section p-type gate electrode 211A indirectly through the impurity undoped region 206b.

As a result, the phosphorous in the SRAM section n-type gate electrode 208A less diffuses toward the SRAM section p-type gate electrode 211A to prevent the pn boundary between the SRAM section n-type gate electrode 208B and the SRAM section p-type gate electrode 211B from reaching a point on the SRAM section gate insulating film 204 located on the SRAM section n-type well region 202 over the element isolation region 201, thereby securing the transistor characteristics of the SRAM section n-type MIS transistor and the SRAM section p-type MIS transistor.

Accordingly, in contrast to the conventional example, it is unnecessary to increase the width of the element isolation between the SRAM section n-type MIS transistor and the SRAM section p-type MIS transistor for the purpose of securing the transistor characteristics of the SRAM section n-type MIS transistor and the SRAM section p-type MIS transistor, which leads to minimization of the width of the element isolation there between, resulting in reduction in area of the SRAM cells.

In addition, the impurity concentration of the logic circuit section n-type gate electrode 209B and the impurity concentration of the logic circuit section p-type gate electrode 212B can be increased while the transistor characteristics of the SRAM section n-type MIS transistor and the SRAM section p-type MIS transistor are secured with no increase in width of the element isolation between the SRAM section n-type MIS transistor and the SRAM section p-type MIS transistor invited.

Hence, the transistor characteristics of the logic circuit section n-type MIS transistor and the logic circuit section p-type MIS transistor can be improved while the width of the element isolation between the SRAM section n-type MIS transistor and the SRAM section p-type MIS transistor is minimized.

As described above, in the present embodiment, the n-type impurity is implanted to only a part of the gate electrode formation film 206 on the n-type MIS formation region in the SRAM section to minimize the width of the element isolation between the SRAM section n-type MIS transistor and the SRAM section p-type MIS transistor. Further, the transistor characteristic of the logic circuit section n-type MIS transistor and the logic circuit section p-type MIS transistor can be improved in the logic circuit section that determines the operation speed of the semiconductor device.

It is noted that though Embodiments 1 and 2 refer to the case using a SiONn film as the gate insulating film composing each conductivity type MIS transistor, the present invention is not limited thereto and may use a high-k film, such as HfSiON film or the like.

Similarly, though Embodiments 1 and 2 refers to the case using polysilicon electrodes of which surfaces are silicided as the gate electrodes composing the respective conductivity type MIS transistors, the present invention is not limited thereto and may use, for example, FUSI (Full Silicided) electrodes of which entireties are silicided as the gate electrodes.

In Embodiments 1 and 2, which employs a combination of polysilicon electrodes and a SiON film, the impurity concentrations of the logic circuit section gate electrodes are increased to reduce the logic circuit section gate insulating film in thickness electrically, thereby improving the transistor characteristics of the logic circuit section MIS transistors. The present invention, however, is not limited thereto. For example, in the case employing a combination of, for example, FUSI gate electrodes and a high-k film or a SiON film, when the impurity concentrations of the logic circuit section gate electrodes are increased for controlling the threshold voltages of the logic circuit section MIS transistors, the transistor characteristics of the logic circuit section MIS transistors can be improved similarly.

As described above, the present invention minimizes the width of the element isolation between the SRAM section n-type MIS transistor and the SRAM section p-type MIS transistor while improving the transistor characteristics of the logic circuit section n-type MIS transistor and the logic circuit section p-type MIS transistor and, therefore, is useful for semiconductor devices including a SRAM section and a logic circuit section and manufacturing methods thereof.

What is claimed is:

1. A semiconductor device manufacturing method, comprising the steps of:
   (a) forming a first gate insulating film on a first element formation region of a semiconductor substrate in a SRAM section while forming a second gate insulating film on a second element formation region of the semiconductor substrate in a logic circuit section;
   (b) forming gate electrode formation films on the first gate insulating film and the second gate insulating film;
   (c) forming a first n-type gate electrode formation film by introducing a first n-type impurity at a first impurity concentration to the gate electrode formation film on the first element formation region;
   (d) forming a second n-type gate electrode formation film by introducing a second n-type impurity at a second impurity concentration higher than the first impurity concentration to the gate electrode formation film on the second element formation region;
   (e) forming, after the step (c) and the step (d), a first n-type gate electrode and a second n-type gate electrode by patterning the first n-type gate electrode formation film and the second n-type gate electrode formation film; and (f) performing, after the step (e), thermal treatment to diffuse the first n-type impurity contained in the first n-type gate electrode and the second n-type impurity contained in the second n-type gate electrode.

2. The semiconductor device manufacturing method of claim 1, further comprising the step of (g) forming, before the step (a), a first element isolation region in the semiconductor substrate in the SRAM section, the first element isolation region separating the first element formation region and a third element formation region, wherein the step (a) includes the step of forming a third gate insulating film on the third element formation region, and the step (b) includes the step of forming the gate electrode formation film on the third gate insulating film, and the method further comprising the step of (h) forming, after the step (b) and before the step (e), a first p-type gate electrode formation film by introducing a first p-type impurity at a third impurity concentration to the gate electrode formation film on the third element formation region, wherein the step (e) includes the step of forming a first p-type gate electrode by patterning the first p-type gate electrode formation film, the step (f) includes the step of diffusing the first p-type impurity contained in the first p-type gate electrode, and in the step (e), the first n-type gate electrode formation film and the first p-type gate electrode formation film are patterned so that the first n-type gate electrode and the first p-type gate electrode are formed integrally with each other.

3. The semiconductor device manufacturing method of claim 2, wherein a pn boundary between the first n-type gate electrode and the first p-type gate electrode after the thermal treatment in the step (f) is located at a point on the first element isolation region.

4. The semiconductor device manufacturing method of claim 2, wherein the step (g) includes the step of forming a second element isolation region in the semiconductor substrate in the logic circuit section, the second element isolation region separating the second element formation region and a fourth element formation region, the step (a) includes the step of forming a fourth gate insulting film on the fourth element formation region, and the step (b) includes the step of forming the gate electrode formation film on the fourth gate insulating film, and the method further comprising the step of: (i) forming, after the step (b) and before the step (e), a second p-type gate electrode formation film by introducing a second p-type impurity at a fourth impurity concentration to the gate electrode formation film on the fourth element formation region, wherein the step (e) includes the step of forming a second p-type gate electrode by patterning the second p-type gate electrode formation film, the step (f) includes the step of diffusing the second p-type impurity contained in the second p-type gate electrode, and in the step (e), the second n-type gate electrode formation film and the second p-type gate electrode formation film are patterned so that the second n-type gate electrode and the second p-type gate electrode are formed integrally with each other.

5. The semiconductor device manufacturing method of claim 4, wherein the step (h) and the step (i) are performed simultaneously, the first p-type impurity is same as the second p-type impurity, and the third impurity concentration is equal to the fourth impurity concentration.

6. The semiconductor device manufacturing method of claim 4, wherein, a pn boundary between the second n-type gate electrode and the second p-type gate electrode after the thermal treatment in the step (f) is located at a point on the second element isolation region.

7. The semiconductor device manufacturing method of claim 4, wherein in the step (g), the first element isolation region has a width in a gate width direction smaller than the second element isolation region.

8. The semiconductor device manufacturing method of claim 1, wherein in the step (e), the first n-type gate electrode has a width in a gate width direction smaller than the second n-type gate electrode.

9. A semiconductor device manufacturing method, comprising the steps of:

(a) forming a first gate insulating film on a first element formation region of a semiconductor substrate in a SRAM section while forming a second gate insulating film on a second element formation region of the semiconductor substrate in a logic circuit section;

(b) forming gate electrode formation films on the first gate insulating film and the second gate insulating film;

(c) forming a first n-type gate electrode formation film by introducing a first n-type impurity at a first impurity concentration to a part of the gate electrode formation film on the first element formation region which is a region other than a region located on at least one of end parts of the first element formation region so that the first n-type gate electrode formation film is composed of an impurity undoped region located at the one end part thereof and an n-type impurity doped region;

(d) forming a second n-type gate electrode formation film by introducing a second n-type impurity at a second impurity concentration to the gate electrode formation film on the second element formation region;

(e) forming, after the step (c) and the step (d), a first n-type gate electrode and a second n-type gate electrode by patterning the first n-type gate electrode formation film and the second n-type gate electrode formation film; and (f) performing, after the step (e), thermal treatment to diffuse the first n-type impurity contained in the first n-type gate electrode and the second n-type impurity contained in the second n-type gate electrode.

10. The semiconductor device manufacturing method of claim 9, wherein the step (c) and the step (d) are performed simultaneously, the first n-type impurity is same as the second n-type impurity, and the first impurity concentration is equal to the second impurity concentration.

11. The semiconductor device manufacturing method of claim 9, further comprising the step of: (g) forming, before the step (a), a first element isolation region in the semiconductor substrate in the SRAM section, the first element isolation region separating the first element formation region and a third element formation region, wherein the step (a) includes the step of forming a third gate insulating film on the third element formation region, and the step (b) includes the step of forming the gate electrode formation film on the third gate insulating film, and the method further comprising the step of: (h) forming, after the step (b) and before the step (e), a first p-type gate electrode formation film by introducing a first p-type impurity at a third impurity concentration to the gate electrode formation film on the third element formation region, wherein the step (e) includes the step of forming a first p-type gate electrode by patterning the first p-type gate electrode formation film, the step (f) includes the step of diffusing the first p-type impurity contained in the first p-type gate electrode, and in the step (e), the first p-type gate electrode formation film and the first n-type gate electrode formation film, which is composed of the impurity undoped region and the n-type impurity doped region, are patterned so that the first p-type gate electrode and the first n-type gate electrode are formed integrally with each other.

12. The semiconductor device manufacturing method of claim 11, wherein a pn boundary between the first n-type gate electrode and the first p-type gate electrode after the thermal treatment in the step (f) is located at a point on the first element isolation region.

13. The semiconductor device manufacturing method of claim 11, wherein the step (g) includes the step of forming a second element isolation region in the semiconductor substrate in the logic circuit section, the second element isolation region separating the second element formation region and a fourth element formation region, the step (a) includes the step of forming a fourth gate insulating film on the fourth element formation region, and the step (b) includes the step of forming the gate electrode formation film on the fourth gate insulating film, and the method further comprising the step of (i) forming, after the step (b) and before the step (e), a second p-type gate electrode formation film by introducing a second p-type impurity at a fourth impurity concentration to the gate electrode formation film on the fourth element formation region, wherein the step (e) includes the step of forming a second p-type gate electrode by patterning the second p-type gate electrode formation film, the step (f) includes the step of diffusing the second p-type impurity contained in the second p-type gate electrode, and in the step (e), the second n-type gate electrode formation film and the second p-type gate electrode formation film are patterned so that the second n-type gate electrode and the second p-type gate electrode are formed integrally with each other.

* * * * *